Jan. 22, 1963 N. E. LINDENBLAD 3,074,242

THERMOELECTRIC HEAT PUMPS

Filed Aug. 24, 1961

INVENTOR.

NILS E. LINDENBLAD

BY Morris A. Rabkin

ATTORNEY

United States Patent Office 3,074,242

Patented Jan. 22, 1963

3,074,242

THERMOELECTRIC HEAT PUMPS

Nils E. Lindenblad, Princeton, N.J., assignor to Radio Corporation of America, a corporation of Delaware Filed Aug. 24, 1961, Ser. No. 133,626
13 Claims. (Cl. 62—3)

Figures 1, 1A, 2, 3:
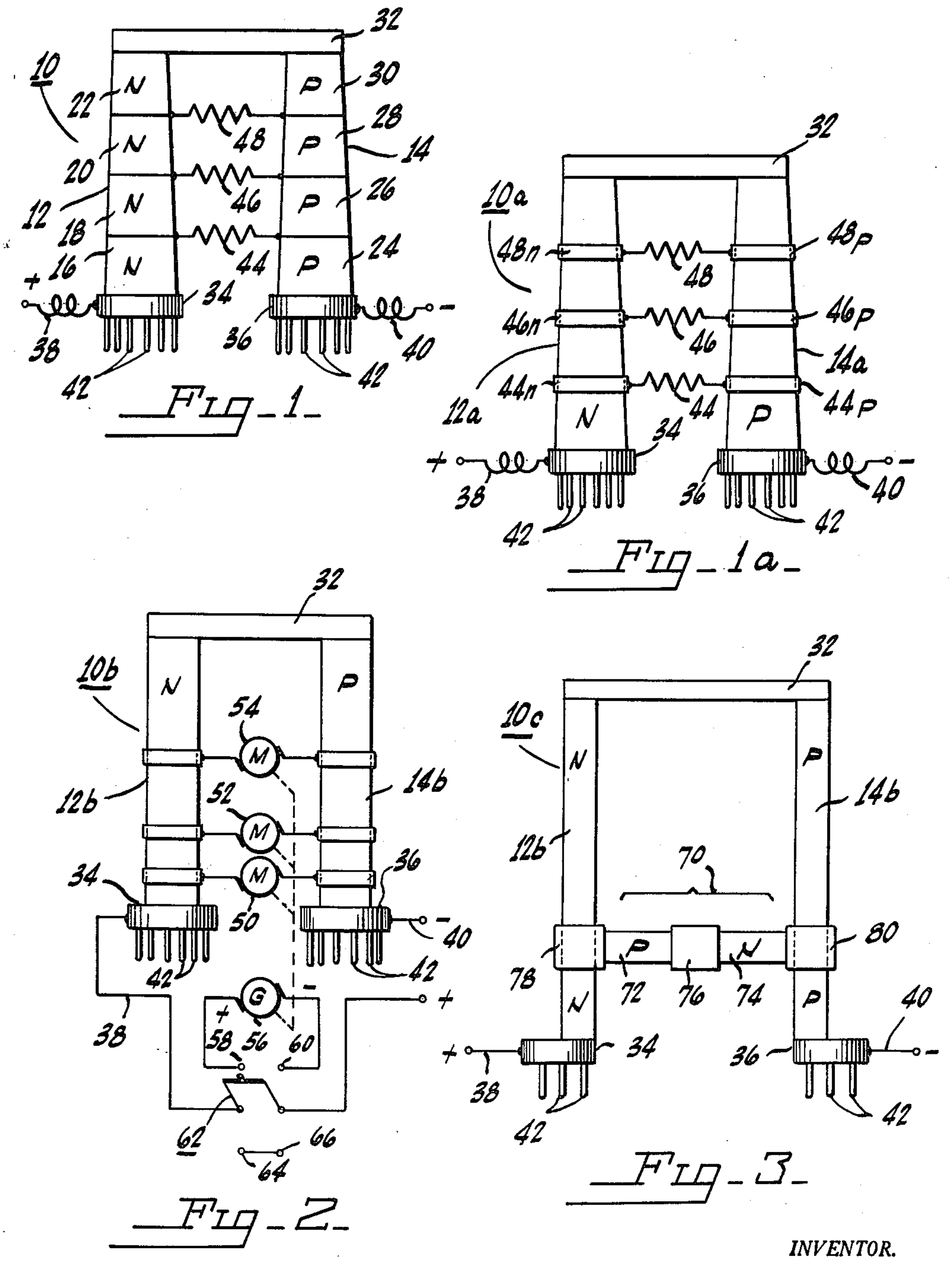

This invention relates generally to thermoelectric heat pumps, and more particularly to novel thermoelectric structures adapted to pump heat over a wider range of temperatures than is possible with a single thermocouple. The novel thermoelectric structures of the present invention are particularly useful in cooling systems employing the Peltier effect.

When a direct current is sent through a thermocouple comprising two dissimilar thermoelectric elements, one end of each element, the cold junction, absorbs heat, and the other end of each element, the hot junction, gives off heat. At present, however, the temperature differential attainable between the hot and cold junctions of a single thermocouple is limited. It has been proposed to arrange thermocouples in a cascaded structure to pump heat over a wider range of temperatures than is possible with a single thermocouple. An example of a heat pump employing such a cascaded arrangement of thermocouples is described in the U.S. Patent 2,844,638, issued to N. E. Lindenblad on July 22, 1958. In such prior art arrangements, however, it is necessary to separate the tandemly arranged thermocouples by separators that are good conductors of heat but poor conductors of electricity. Also, such arrangements require the use of a plurality of thermocouples, each having a plurality of soldered junctions wherein Joulean heat losses occur due to the contact resistance presented.

It is an object of the present invention to provide novel thermoelectric structures that employ but two integral thermoelectric elements, connected to function as a plurality of cascaded thermocouples, and useful as a heat pump that is adapted to produce a temperature differential between its hot and cold junctions that is greater than that obtainable with a single thermocouple.

Another object of the present invention is to provide novel thermoelectric structures for thermocouples, which structures employ only two, integral, dissimilar thermoelectric elements and and are adapted to pump heat over a wider range of temperatures than is possible with prior single thermocouples.

Still another object of the present invention is to provide novel thermoelectric structures that function as cascaded thermocouples but do not require thermally conductive and electrically insulating separators between thermocouples.

A further object of the present invention is to provide novel thermoelectric structures that function as a cascaded arrangement of thermocouples but which have relatively less soldered connections than prior art arrangements, thereby minimizing Joulean heat losses.

Still a further object of the present invention is to provide novel heat pumps that are relatively compact and simple in construction, and that lend themselves to economical mass production manufacturing.

In accordance with the present invention, each of the novel thermoelectric structures for a heat pump comprises a thermocouple of two dissimilar thermoelectric elements that establish cold and hot junctions when a current is passed through the thermocouple. Electrical loading means are connected between the thermoelectric elements at suitable points intermediate the ends of the thermoelectric elements to bleed current from them. Thus, cooling takes place not only at the extreme ends of the thermoelectric elements, but also at each bleeder point. This action produces successive cool spots along each of the thermoelectric elements, thereby aiding in pumping heat in a cumulative manner. The energy required by the loading means may be utilized as electrical, mechanical, or heat energy.

The novel features of the present invention, both as to its organization and method of operation, as well as additional objects and advantages thereof, will be more readily understood from the following description, when read in connection with the accompanying drawings in which similar reference characters designate similar parts throughout, and in which:

FIG. 1 is a schematic diagram of a novel thermoelectric structure for a heat pump illustrating the bleeder principle in accordance with the present invention;

FIG. 1*a* is a schematic diagram of a thermoelectric structure for a heat pump similar to that of FIG. 1, but using only two integral thermoelectric elements in accordance with the present invention to reduce Joulean heat losses;

FIG. 2 is a schematic view of a thermoelectric structure for a heat pump employing loading means that convert electrical energy into mechanical energy in accordance with the present invention; and FIG. 3 is a schematic view of a thermoelectric structure for a heat pump employing loading means in the form of a thermocouple to convert electrical energy into heat energy in a direction to aid the thermoelectric structure to pump heat in accordance with the present invention.

Referring, now, to FIG. 1, there is shown a thermoelectric structure 10 comprising an N-type thermoelectric element 12 and a P-type thermoelectric element 14. The N-type element 12 comprises a plurality of frusta 16, 18, 20, and 22 of cones or pyramids soldered together to form a continuous frustum. The P-type element 14 also comprises a plurality of frusta 24, 26, 28, and 30 of cones or pyramids soldered to each other and aligned to form a continuous frustum.

The N-type and P-type elements 12 and 14 are made from semiconductor materials used in thermocouples. An example of N-type material is an alloy of bismuth telluride and bismuth selenide having the formula 75% $Bi_2Te_3$–25% $Bi_2Se_3$. An example of P-type material is an alloy of bismuth telluride and antimony telluride having the formula 25% $Bi_2Te_3$–75% $Sb_3Te_3$.

The N-type frustum 22 is electrically connected to the P-type frustum 30 by means of electrically and thermally conductive material, such as a bar 32 of copper. The bar 32 is soldered to the ends of the frusta 22 and 30 and forms cold junction means therewith. Heat sink means, such as bars 34 and 36 of copper, are soldered to the ends of the frusta 16 and 24 to form hot junction means therewith. Electrical leads 38 and 40 are connected to the heat sink bars 34 and 36, respectively, to apply a source of unidirectional voltage therebetween, as indicated in FIG. 1, to send current through the thermocouple formed by the thermoelectric elements 12 and 14 and the bar 32. A plurality of heat radiating fins 42 extend from the heat sink bars 34 and 36 to radiate heat from the hot junctions of the thermocouple.

Electrical loading means are provided to bleed current from the thermocouple at suitable points along the thermoelectric element 12. To this end, a resistor 44 is connected between a point on the soldered junction between the frusta 16 and 18 of the element 12 and a point on the soldered junction between the frusta 24 and 26 of the element 14. Similarly, a resistor 46 is connected between a point of the soldered junction between the frusta 18 and 20 of the element 12 and a point on the soldered junction between the frusta 26 and 28 of the element 14. A resistor 48 is also connected between a point on the soldered junction between the frusta 20 and 22 of the element 12 and a point on the soldered junction between the frusta 28 and 30 of the element 14. It will now be understood that current from the lead 38 to the lead 40 will flow through the bar 32 and through the resistors 44, 46, and 48 connected in parallel with each other and in parallel with the bar 32.

The thermoelectric structure 10 functions as a heat pump employing a plurality (four in the illustrated form shown in FIG. 1) of cascaded thermocouples to achieve cumulative cooling. The resistor 44 and the frusta 16 and 24 function as one thermocouple; the resistor 46 and the frusta 18 and 26 function as a second thermocouple; the resistor 48 and the frusta 20 and 28 function as a third thermocouple; and the bar 32 and the frusta 22 and 30 function as the fourth thermocouple. While only four thermocouples are shown and described in this embodiment, it will be understood that this thermoelectric structure is merely illustrative of the instant invention and is not to be construed in a limiting sense.

The maximum refrigerating capacity of each thermocouple requires an optimum operating current because Peltier cooling increases linearly with current while Joulean heat increases quadratically with current. The values of resistance of the resistors 44, 46, and 48, as well as the resistance of the frusta of the thermoelectric elements 12 and 14, should therefore be chosen so that the curent through each thermocouple of the structure 10 is optimized for maximum cooling. The resistances of the frusta of the thermoelectric elements 12 and 14 are determined by their lengths and effective cross-sections. Thus, for example, the resistance of each of the frusta 22 and 30 is relatively higher than that of the frusta 16 and 24, the former frusta being adapted to carry less current than the latter.

In operation, a source of voltage is applied between the leads 34 and 40, and current flows through each of the resistors 44, 46, and 48, and through the bar 32. According to the Peltier effect, heat is pumped from the bar 32 to the heat sink bars 34 and 36. Since the illustrative structure 10 functions as a heat pump employing four cascaded thermocouples, the effective range of temperatures over which the heat is pumped should theoretically be four times as great as that possible with a single thermocouple employing N-type and P-type thermoelectric element sof the type described.

The cumulative cooling obtained with the thermoelectric structure 10 will not be as great as the theoretical amount possible, partly because of the Joulean heat losses occuring in the soldered sections between the frusta of the thermoelectric elements 12 and 14 and partly because of the non-linearity of cooling exhibited by most thermocouples over a large range of temperatures. The Joulean heat losses may be minimized in the thermoelectric structure 10*a*, shown in FIG. 1*a* where each of the thermoelectric elements 12*a* and 14*a* comprises an integral structure. Thus, the thermoelectric element 12*a* comprises a single frustum of N-type material, and the thermoelectric element 14*a* comprises a single frustum of P-type material. The resistors 44, 46, and 48 are electrically connected to the elements 12*a* and 14*a* by means of pairs of metal collars 44*n* and 44*p*, 46*n* and 46*p*, and 48*n* and 48*p*, respectively.

The operation of the thermoelectric structure 10*a* as a heat pump is substantially the same as that described for the thermoelectric structure 10 of FIG. 1. However, Joulean heat losses are reduced because current can now flow through the integral elements 12*a* and 14*a* without being impeded by the contact resistance offered by soldered connections.

Since the loading means in the form of the resistors 44, 46, and 48 dissipate energy in the form of heat during operation, the utility and efficiency of the thermoelectric structures 10 and 10*a* can be improved by utilizing this dissipated energy. Referring to FIG. 2, there is shown a thermoelectric structure 10*b* wherein the energy required by the loading means of the cascaded thermocouples is converted into mechanical energy by means of motors 50, 52, and 54. The motors 50, 52, and 54 are mechanically coupled to a direct current generator 56 to convert the mechanical energy to electrical energy. The output of the generator 56 is connected to a pair of terminals 58 and 60 of a double pole-double throw switch 62. The armatures of the switch 62 are connected to the lead 38 so as to connect the output of the generator 56 in series with a source of operating voltage, as when they contact the terminals 58 and 60. When in contact with a pair of connected switch terminals 64 and 66, the armatures of the switch 62 connect the source of operating voltage directly to the thermoelectric structure 10*b*.

In the embodiment of the thermoelectric structure 10*b*, the N-type and P-type thermoelectric elements 12*b* and 14*b*, respectively, are integral structures of uniform cross-section. In order to obtain maximum cooling for each thermocouple formed by the structure 10*b*, the motors 50, 52, and 54 are connected between the thermoelectric elements 12*b* and 14*b* at appropriate points, depending upon the resistance of the thermoelectric elements. The operation of the thermoelectric structure 10*b* as a heat pump is substantially similar to that of the structures 10 and 10*a*. To operate the thermoelectric structure 10*b*, the armatures of the switch 62 are made to contact the terminals 64 and 66. Heat is now pumped from the bar 32 to the heat sink bars 34 and 36. The points along the thermoelectric elements 12*b* and 14*b* that are connected to the motors 50, 52, and 54 become points of progressively lower temperatures, respectively, and aid in pumping the heat from the bar 32 to the heat sink bars 34 and 36. The closer these points are to the bar 32 the colder they are. Current flowing through the motors 50, 52, and 54 energizes them, and their mechanical energy is coupled to the generator 56 to operate the latter. The electrical energy derived from the generator 56 can be applied in series (or parallel) with the operating voltage of the heat pump through the switch 62, thereby utilizing the loading energy to increase the efficiency of the heat pump.

Referring, now, to FIG. 3, there is shown a thermoelectric structure 10*c* of two cascaded thermocouples and wherein the loading means for one of these thermocouples comprises another thermocouple 70. The thermocouple 70 comprises a P-type thermoelectric element 72 that is electrically connected to an N-type thermoelectric element 74 through an electrically conductive bar 76. The bar 76 forms a hot junction with the elements 72 and 74 when current flows from the element 72 to the element 74. The P-type element 72 is connected to the N-type element 12*b* by means of an electrically conductive collar 78. The N-type element 74 is connected to the P-type element 14*b* by means of an electrically conductive collar 80.

When operating as a heat pump, the thermoelectric structure 10*c* functions as two thermocouples in tandem, the thermocouple 70 functioning as loading means for one of the thermocouples. Thus, the portion of the element 12*b* between the heat sink bar 34 and the collar 78, the thermocouple 70, and the portion of the element 14*b* between the collar 80 and the heat sink bar 36 function as one thermocouple of the thermoelectric structure 10*c*. The portions of the thermoelectric elements 12*b* and 14*b* between the collars 78 and 80 and the bar 32 comprise, with the bar 32, the second thermocouple of the thermoelectric structure 10*c*. When a voltage is applied between the leads 38 and 40, current flows through the bar 32 and through the thermocouple 70 in parallel with the bar 32. The current bled from the thermoelectric element 12*b* by the thermocouple 70 causes cold junctions to occur at the collars 78 and 80. Theoretically, the temperature difference between one of the heat sink bars 34 and 36 and the cold junction bar 32 can be twice that of the temperature difference between the heat sink bar 34 and the collar 78, or between the sink bar 36 and the collar 80, if the loading means of the two thermocouples provide an optimum current for each one. By positioning the collars 78 and 80 at suitable points on the thermoelectric elements 12b and 14b, respectively, optimum loading of the thermocouples can be accomplished. Current flowing through the loading means comprising the thermocouple 70 produces heat at a bar 76. This heat may be conducted toward a common heat sink by any suitable means for utilization in any desired manner.

From the foregoing description, it will be apparent that there have been provided novel thermoelectric structures that are useful as heat pumps. These novel structures provide a plurality of thermocouples in a cascaded arrangement to achieve a greater cooling effect than can be obtained by a single thermocouple of the prior art. While several embodiments of the invention have been shown in diagrammatic form, variations in these embodiments coming within the spirit of this invention will, no doubt, readily suggest themselves to those skilled in the art. Hence, it is desired that the foregoing shall be considered only as illustrative and not in a limiting sense.

What is claimed is:

1. In a thermocouple of the type comprising two dissimilar thermoelectric elements and adapted to pump heat from one end of each of said elements to the other end of each of said elements when current flows through said thermocouple, the improvement comprising electrical loading means, and means connecting said loading means between said elements at points intermediate said ends of said elements.

2. In a thermocouple structure of the type comprising two integral, dissimilar thermoelectric elements and adapted to pump heat from one end of each of said elements to the other end of each of said elements when current flows in a series circuit through said thermocouple, the improvement comprising electrical loading means, and means connecting said loading means between said elements and in a parallel circuit with said series circuit.

3. A thermocouple structure comprising two dissimilar thermoelectric elements each having two ends, electrically conductive means, means connecting said conductive means between one end of each of said elements to connect said elements in series with each other, means to apply a source of voltage across the other ends of said elements to cause current to flow therethrough, electrical loading means, and means connecting said loading means between said elements at points intermediate said ends of said elements.

4. A thermocouple structure comprising two dissimilar thermoelectric elements each having two ends, electrically conductive means comprising cold junction means, means connecting said conductive means between one end of each of said elements to connect said elements in a series circuit, heat sink means connected to the other end of each of said elements, means to apply a source of voltage across said other ends of said elements to cause current to flow in said series circuit, electric loading means, and means connecting said loading means in parallel with said series circuit, said loading means being connected between a point intermediate the ends of one of said elements and a point intermediate the ends of the other of said elements.

5. A thermoelectric structure comprising N-type and P-type elements each having two ends, electrically conductive means comprising cold junction means, means connecting said conductive means between one end of each of said elements to connect said elements in a series circuit, means sink means connected to the other end of each of said elements, means connected to said other ends of said elements to send current through said series circuit, electrical loading means, and means connecting said loading means in parallel with said series circuit whereby to bleed current from said series circuit, said loading means being connected between a pair of points intermediate said ends of said elements, respectively, whereby to produce cooling at said points with respect to said other ends of said elements.

6. A thermoelectric structure comprising N-type and P-type elements each having two ends, electrically conductive means comprising cold junction means, means connecting said conductive means between one end of each of said elements to connect said elements in a series circuit, means connected to the other ends of each said elements to send current through said series circuit, a plurality of electrical loading means, and means connecting each of said plurality of loading means in parallel with said series circuit whereby to bleed current from said series circuit, each of said plurality of loading means being connected between a separate pair of points intermediate the ends of said elements, respectively, whereby to produce cooling at said points with respect to said other ends of said elements.

7. Apparatus comprising a pair of dissimilar thermoelectric elements each having two ends, electrically conductive means connecting one end of each of said elements together whereby to connect said elements in series with each other, means to apply a source of voltage across the other ends of elements whereby to cause current to flow therethrough, electrical energy converting means, and means connecting said converting means between points intermediate said ends on each of said elements and in parallel with said conductive means whereby to form a current path parallel to the current path through said conductive means.

8. A heat pump comprising two dissimilar thermoelectric elements, each having two ends, cold junction means, means connecting said cold junction means between one end of each of said elements whereby to connect said elements in series with each other, heat sink means connected to the other end of each of said elements, means to apply a source of voltage across said other ends of said elements to cause current to flow therethrough, first converting means to convert electrical energy into mechanical energy, means connecting said first converting means in a parallel circuit with said cold junction means and between points intermediate the ends of said elements, respectively, second converting means for converting mechanical energy into electrical energy, and means coupling said first converting means to said second converting means.

9. A heat pump comprising two dissimilar thermoelectric elements each having two ends, cold junction means, means connecting said cold junction means between one end of each of said elements whereby to connect said elements in series with each other, heat sink means connected to the other end of each of said elements, means to apply a source of voltage across said other ends of said elements to cause current to flow therethrough, first converting means to convert electrical energy to mechanical energy, means connecting said first converting means in a parallel circuit with said cold junction means and between points intermediate the ends of said elements, respectively, second converting means for converting mechanical energy into electrical energy, means coupling said first converting means to said second converting means, and means to connect said second converting means in circuit with said means to apply a source of voltage across said elements.

10. A thermoelectric structure comprising a first thermocouple having two dissimilar thermoelectric elements each having two ends, heat sink means connected to one of said ends of each of said elements, electrically conductive cold junction means, means connecting said cold junction means between the other ends of said elements, means to apply a source of voltage across said one ends of said elements to cause a current to flow therethrough and to pump heat from said cold junction means to said heat sink means, a second thermocouple comprising two thermoelectric elements each having two ends, electrically conductive hot junction means, means connecting said hot junction means between one end of each of said elements of said second thermocouple, means connecting the other end of one of said elements of said second thermocouple to a point intermediate the ends of one of said elements of said first thermocouple to form a cold junction therewith, and means connecting the other end of the other of said elements of said second thermocouple to a point intermediate the ends of the other of said elements of said first thermocouple also to form a cold junction therewith.

11. A thermoelectric structure comprising a first thermocouple having two dissimilar thermoelectric elements each having two ends, heat sink means connected to one of said ends of each of said elements, electrically conductive cold junction means, means connecting said cold junction means between the other ends of said elements, means to apply a source of voltage across said one ends of said elements to cause a current to flow therethrough and to pump heat from said cold junction to said heat sink means, a second thermocouple comprising two thermoelectric elements each having two ends, electrically conductive hot junction means, means connecting said hot junction means between one end of each of said elements of said second thermocouple, means connecting the other end of one of said elements of said second thermocouple to a point intermediate the ends of one of said elements of said first thermocouple to form a cold junction therewith, and means connecting the other end of the other of said elements of said second thermocouple to a point intermediate the ends of the other of said elements of said first thermocouple also to form a cold junction therewith, the electrical resistance between said one end and said point of each of said elements of said first thermocouple being less than the electrical resistance between said other end and said point of each of said elements of said first thermocouple.

12. In a thermocouple of the type comprising two dissimilar thermoelectric elements and adapted to pump heat from one end of each of said elements to the other end of each of said elements when current flows through said thermocouple, the improvement comprising electrical loading means, and means connecting said loading means between said elements at points intermediate said ends of said elements, the electrical resistance between said one end and one of said points of each of said elements being greater than the electrical resistance between said other end and said one point of each of said elements.

13. In a thermocouple of the type comprising two dissimilar thermoelectric elements and adapted to pump heat from one end of each of said elements to the other end of each of said elements when current flows through said thermocouple, the improvement comprising electrical loading means, and means connecting said loading means between said elements at points intermediate said ends of said elements, the electrical resistance between said one end and one of said points of each of said elements being greater than the electrical resistance between said other end and said one point of each of said elements, each of said elements comprising a rod of semiconductor material whose cross-sectional area decreases progressively from said other end to said one end thereof, whereby to increase the electrical resistance progressively from said other end to said one end.

References Cited in the file of this patent

UNITED STATES PATENTS 2,729,949 Lindenblad ---------------- Jan. 10, 1956
3,005,944 Hill -------------------- Oct. 24, 1961